United States Patent [19]

Kiuchi et al.

[11] 4,002,875
[45] Jan. 11, 1977

[54] HIGH FREQUENCY HEATING APPARATUS

[75] Inventors: Mitsuyuki Kiuchi, Toyonaka; Shigeru Kusunoki, Yamato Koriyama; Hiroshi Fujieda, Nara; Keizo Amagami, Takatsuki; Tadao Toyooka, Toyonaka, all of Japan

[73] Assignee: Matsushita Electric Industrial Co., Ltd., Osaka, Japan

[22] Filed: Oct. 10, 1975

[21] Appl. No.: 621,620

[30] Foreign Application Priority Data

Oct. 18, 1974 Japan ............................ 49-120757
Oct. 18, 1974 Japan ............................ 49-120758

[52] U.S. Cl. ...................... 219/10.55 B; 219/10.77; 321/11
[51] Int. Cl.[2] .......................................... H05B 9/06
[58] Field of Search ............. 219/10.55 B, 10.75, 219/10.77; 321/6, 11

[56] References Cited

UNITED STATES PATENTS

| 3,569,656 | 3/1971 | White | 219/10.55 B |
|---|---|---|---|
| 3,710,065 | 1/1973 | Crapuchettes | 219/10.55 B |
| 3,735,237 | 5/1973 | Derby | 219/10.55 B |
| 3,757,197 | 9/1973 | Bailey | 219/10.77 X |
| 3,761,667 | 9/1973 | Walden | 219/10.77 X |
| 3,786,219 | 1/1974 | Kornrumpf | 219/10.77 X |
| 3,814,888 | 6/1974 | Bowers et al. | 219/10.77 X |
| 3,821,509 | 6/1974 | Amagami et al. | 219/10.77 |
| 3,823,296 | 7/1974 | Amagami et al. | 219/10.77 |

FOREIGN PATENTS OR APPLICATIONS

| 1,556,837 | 12/1968 | France | 219/10.55 B |

*Primary Examiner*—Arthur T. Grimley
*Attorney, Agent, or Firm*—Wenderoth, Lind & Ponack

[57] ABSTRACT

A high frequency heating apparatus in which a combination of a microwave oven for heating food through dielectric heating and a cooking device for heating metallic vessel through electrical induction is incorporated to effect efficient cooking and simultaneous formation of brown scorching on the surface of food. In the heating apparatus, power required for the magnetron of the microwave oven and also for the heating coil of the cooking device is supplied through one inverter unit, by which arrangement, an efficient cooking apparatus of compact size is presented.

16 Claims, 11 Drawing Figures

HIGH FREQUENCY HEATING APPARATUS

The present invention relates to a high frequency heating apparatus and, more particularly, to a high frequency heating apparatus wherein there is incorporated a combination of a microwave oven for heating an object or food through dielectric heating and a cooking device for heating a vessel such as a pan or pot of metallic material through induction heating.

In the conventional microwave ovens, high frequency oscillator tubes such as magnetrons are generally employed for directly heating food materials to be cooked through dielectric heating. While suitable for cooking food in a short period of time, such conventional microwave ovens have serious disadvantages in that the food cooked thereby is difficult to be done brown, i.e., to be burnt or scorched brown to such an extent that the same stimulates one's appetite, and that in this respect, cooking by such ovens is not necessarily be easy.

In order to overcome such disadvantages, there have recently been developed various cooking devices utilizing induction heating in the field of cooking apparatuses, which induction heating cooking devices are characterized in that they can be easily cleaned, having no elements to be directly heated up to a high temperature level for heat radiation, while being capable of effecting ordinary cooking as done by electric heaters or gas ovens. For similar purpose, there have also been proposed some cooking ovens wherein microwave ovens are combined with conventional electric heaters or gas cooking devices, but such cooking ovens still have some disadvantages from the viewpoint of handling and easiness in cooking operations.

Accordingly, an essential object of the present invention is to provide a high frequency heating apparatus wherein a microwave oven and an induction heating coil are incorporated in a casing for efficient cooking and simultaneous formation of brown scorching on the surface of food to be cooked with substantial elimination of the disadvantages inherent in the conventional high frequency heating apparatus.

Another important object of the present invention is to provide a high frequency heating apparatus of the above described type which is compact in size and easy to operate.

A further object of the present invention is to provide a high frequency heating apparatus of the above described type which is simple in construction and can be manufactured at low cost.

A still further object of the present invention is to provide a high frequency heating apparatus of the above described type in which output of high frequency oscillator is controlled through employment of an inverter.

According to a preferred embodiment of the present invention, an inverter unit is employed for serving as a high frequency power source to be supplied to an induction heating coil, and also an excitation source for a high frequency oscillator tube such as a magnetron, while a combination of a microwave oven and the induction heating coil is advantageously incorporated in a casing through omission of the conventional transformer of ferro-resonance type, and through reduction in size of a high voltage generator by the high frequency inverter unit, thus the problem of absence of brown scorching on the surface of cooked food experienced in the conventional microwave ovens being advantageously solved. The inverter unit includes a single thyristor, a resonance circuit and a step-up transformer, with the induction heating coil and the excitation unit such as the magnetron for dielectric heating being further provided, and with the output of the high frequency generator adapted to be controlled by the inverter, thus the number of circuit components being reduced to a large extent so as to offer an efficient and economical cooking apparatus. Furthermore, since the output of the inverter unit is applied to the induction heating coil on one hand and to the step-up transformer for the magnetron on the other, it is possible for the heating apparatus to be constructed either to energize the heating coil and the magnetron simultaneously or to energize the same alternately through employment of a changeover switch.

These and other objects and features of the present invention will become apparent from the following description taken in conjunction with the preferred embodiment thereof with reference to the attached drawings, in which;

FIG. 3a is a perspective view of a high frequency heating apparatus in which the circuits of FIGS. 1 and 2 may be incorporated;

FIG. 3b is a schematic cross sectional view of the high frequency heating apparatus of FIG. 3a;

FIG. 8a is a similar view to FIG. 3a, but particularly shows a modification thereof;

FIG. 8b is a schematic cross sectional view of the high frequency heating apparatus of FIG. 8a;

Before the description of the present invention proceeds, it should be noted that like parts are designated by like reference numerals throughout several views and diagrams of the attached drawings.

Figure 1:
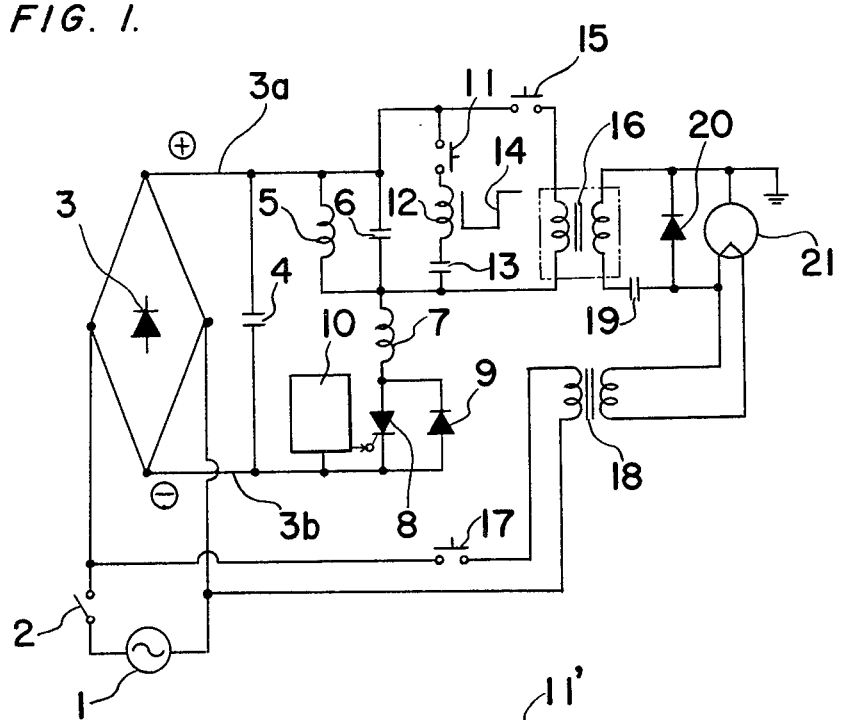
FIG. 1 is an electrical circuit diagram showing circuit construction of a high frequency heating apparatus according to one embodiment of the present invention.

Referring now to FIG. 1 showing one embodiment of circuit construction of a high frequency heating apparatus according to the invention, upon closure of a switch 2, A.C. power from a power source 1 is supplied to a primary winding of a heater transformer 18 for a magnetron 21 through a switch 17, and to a diode bridge circuit 3 for full-wave rectification thereof, and thence onto lines 3a and 3b connected to output terminals of the circuit 3, the line 3a being positive with respect to the line 3b. Across the lines 3a and 3b, there is connected an input capacitor 4 which is in parallel with a circuit comprising a thyristor 8 which is counter-parallel to a diode 9 and in series with a commutation inductance coil or inductor 7 and a circuit having a commutation capacitor 6 and a choking coil 5 in parallel. It should be noted that the thyristor 8 and the series-connected commutation capacitor 6 and commutation inductance coil 7 are essential components constituting an inverter unit for converting the D.C. output from the circuit 3 into high frequency electric power. The gate of the thyristor 8 is connected to a control circuit 10, with the anode of said thyristor 8 connected to the positive side of the D.C. output and the cathode thereof to the negative side of the same, thus the thyristor 8 being turned on or off through the control circuit 10. The capacitor 6 is connected to a circuit having a switch 11, a heating coil 12 and a filter capacitor 13 in series, which heating coil 12 is for heating an object 14 of metallic material such as a pan or pot and consequently food contained therein through electrical induction. It is to be noted that, since a sine wave high frequency current flows through the heating coil 12, radiation of noises is advantageously prevented in heating the pan or the like. The capacitor 6 is further connected in parallel to a primary winding of a step-up transformer 16 through a switch 15, while the secondary winding of the transformer 16 is connected to a circuit having a capacitor 19 and a diode 20 in series to form a high voltage generator, with the high frequency oscillator 21 such as the magnetron being connected in parallel to the diode 20. The plate side of the magnetron 21 is connected to earth, while the cathode thereof is coupled to the secondary winding of the heater transformer 18 and also to the cathode of the diode 20, in which construction, the capacitor 19 and the diode 20 form a voltage multiplying rectifier circuit.

By this arrangement, the thyristor 8 triggered by the control circuit 10 is periodically turned off through the commutation circuit including the choking coil 5, the capacitor 6 and the inductance coil 7, with oscillation thus being started. Upon closure of the switch 11, the high frequency current flows through the heating coil 12, and the metallic object 14 such as the pan or pot can be heated by the eddy current arising from the high frequency magnetic field, while closure of the switches 15 and 17 causes a high voltage to be applied to the magnetron 21 for radiating electromagnetic waves therefrom so as to heat food material or the like.

Figure 2:
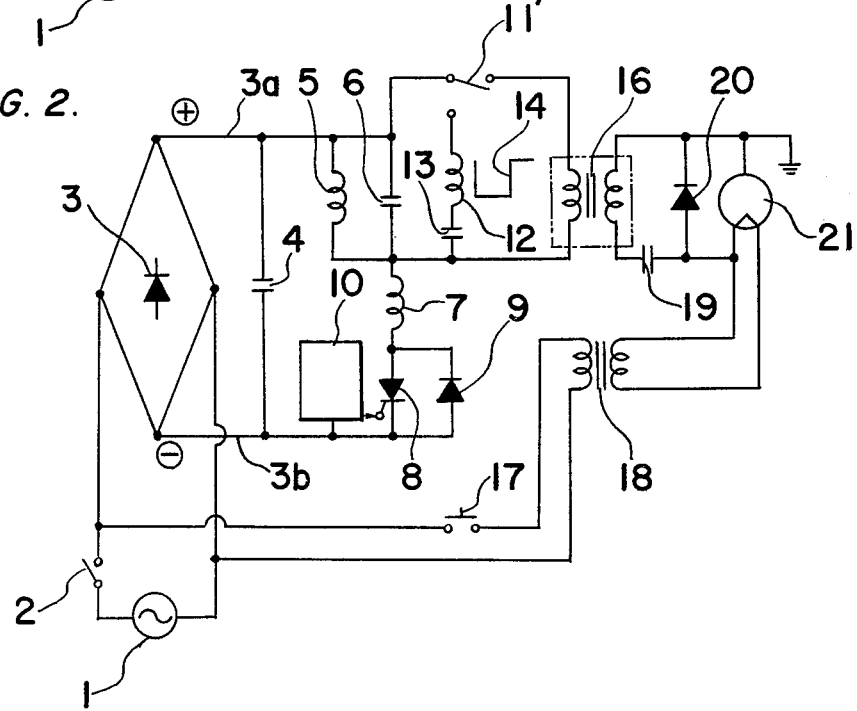
FIG. 2 is a similar diagram to FIG. 1, but particularly shows a modification thereof.

Referring to FIG. 2 there is shown a modification of the circuit of FIG. 1. In this modification, the switches 11 and 15 described as employed in the embodiment of FIG. 1 are replaced by one switch 11' whose contactor can selectively be switched over to the induction heating coil 12 and the step-up transformer 16 for the high frequency oscillator to apply the output alternately thereto, although other circuit construction and function thereof are exactly the same as those in FIG. 1.

Figure 3:
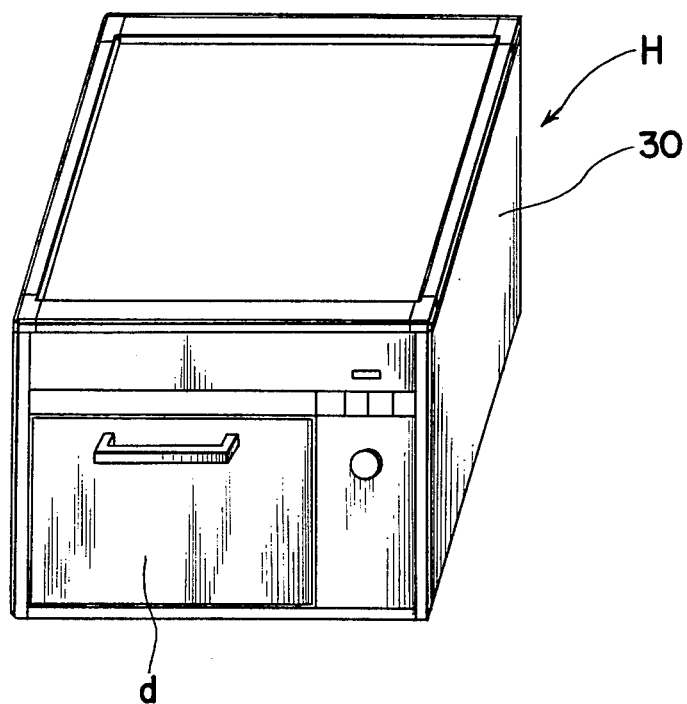
Figure 3:
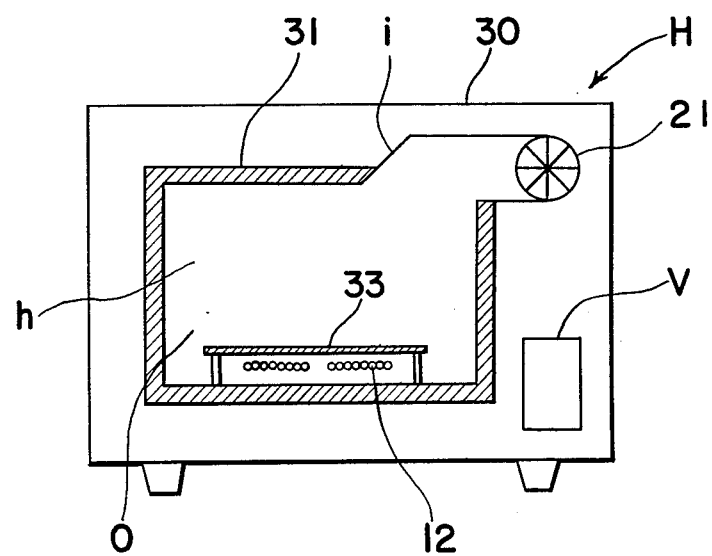

Referring now to FIGS. 3a and 3b, there is shown a high frequency heating apparatus of the invention in which the circuit of FIG. 1 or FIG. 2 may be incorporated. The heating apparatus H includes an outer casing 30 of cubic box-like configuration open at the front side thereof, which outer casing 30 has a double wall structure and includes inner walls $i$ forming a heating cavity or oven chamber $h$, these inner walls $i$ including a horizontal base plate, vertical side walls, a top wall and a rear wall and thus defining an access opening O at the front of the oven. Outer surfaces of the inner walls $i$ are preferably spaced away from the corresponding walls of the outer casing 30 so as to provide spaces therebetween. The heating apparatus H further includes a door $d$ which is hingedly supported, at the lower edge thereof, to the lower front edge of the casing 30, in a position corresponding to the access opening O for selectively opening and closing the opening O, through which the metallic object and food to be heated are inserted into the chamber $h$. Within the spaces between the inner walls and the outer casing 30, the surfaces of the inner walls $i$ are covered with heat insulating member 31 and the magnetron 21 is disposed at right-hand upper portion for radiating high frequency energy into the chamber $h$. A flat ceramic or glass plate 33 of heat-resistant nature is disposed within the heating chamber $h$ in spaced and parallel relation to the horizontal base plate of the chamber $h$, with the heating coil 12 being suitably disposed in the space between the plate 33 and the base plate of the chamber $h$. At the right-hand lower portion in the space between one side wall of the chamber $h$ and the casing 30 there is provided the inverter unit V as a power source for the heating coil 12 and the magnetron 21.

By this arrangement, upon exciting the magnetron 21 through the inverter unit V, with food placed in the chamber $h$, the food is heated by the high frequency energy radiated from the magnetron 21, while when a metallic pot or the like containing food therein is placed on the plate 33, with the heating coil 12 being supplied with the high frequency current from the inverter unit V, the pot is heated through induction, thus the food contained therein being suitably cooked.

It is needless to say that either of the switches 11 and 15 of FIG. 1 or the switch 11' of FIG. 2 may be employed in the above described heating apparatus H for switching over the output to be supplied to the heating coil 12 or the magnetron 21, and that food may be placed, directly or through a suitable medium such as an aluminum foil, on the plate 33 for rapid formation of the brown scorching thereon.

Figure 4:
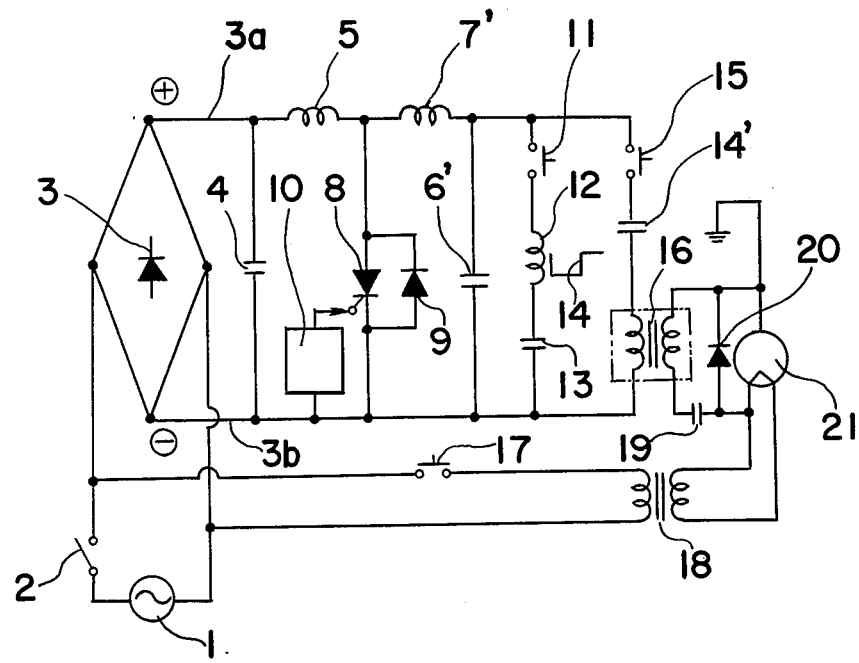
FIGS. 4 to 7 are similar diagrams to FIG. 1, but particularly show modifications thereof.

Reference is made to FIG. 4 wherein another modification of the circuit of FIG. 1 is shown. In this modification, a circuit having a commutation capacitor 6' and the commutation inductance coil 7' in series is connected in parallel with the thyristor 8 to form an inverter unit, while the choking coil 5 is connected between the positive side of the D.C. voltage source or the circuit 3 and the anode of the thyristor 8, with a filter capacitor 14' inserted between the switch 15 and the primary winding of the transformer 16. The function of the circuit of FIG. 4 is exactly the same as that of FIG. 1 with some alterations in the connections of the circuit elements, so that detailed description thereof is abbreviated for brevity.

Figure 5:
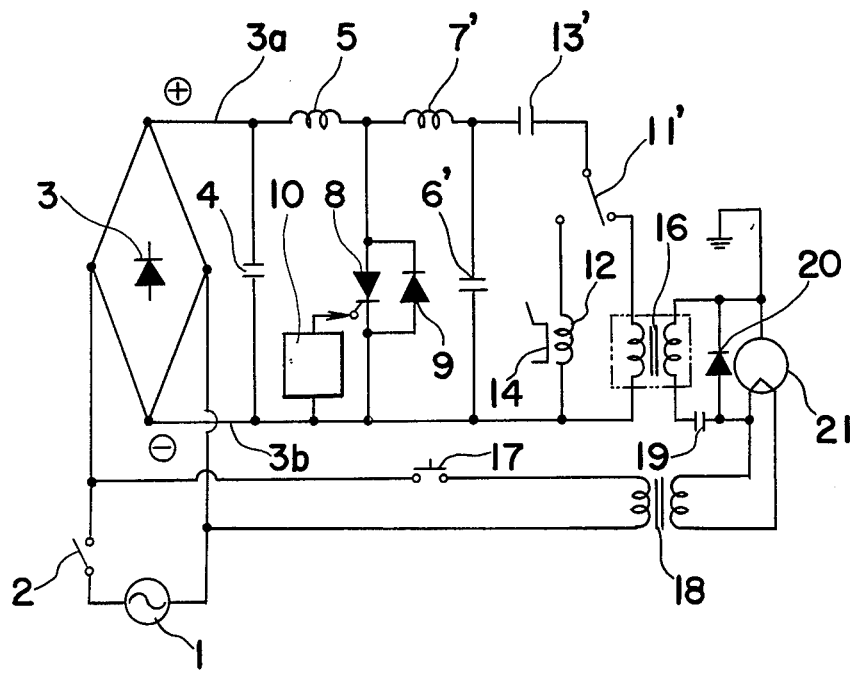

Shown in FIG. 5 is a further modification of the circuit of FIG. 4, in which modification the filter capacitor 13 connected in series to the heating coil 12 and the filter capacitor 14' which is in series connection to the primary winding of the step-up transformer 16 described as employed in the circuit of FIG. 4 are replaced by one filter capacitor 13', with the switches 11 and 15 being also replaced by the switch 11' as employed in the modification of FIG. 2. In this circuit of FIG. 5 also, the thyristor 8 is connected in parallel to the series-connected commutation capacitor 6' and inductance coil 7' to form the essential part of the inverter unit.

Figure 6:
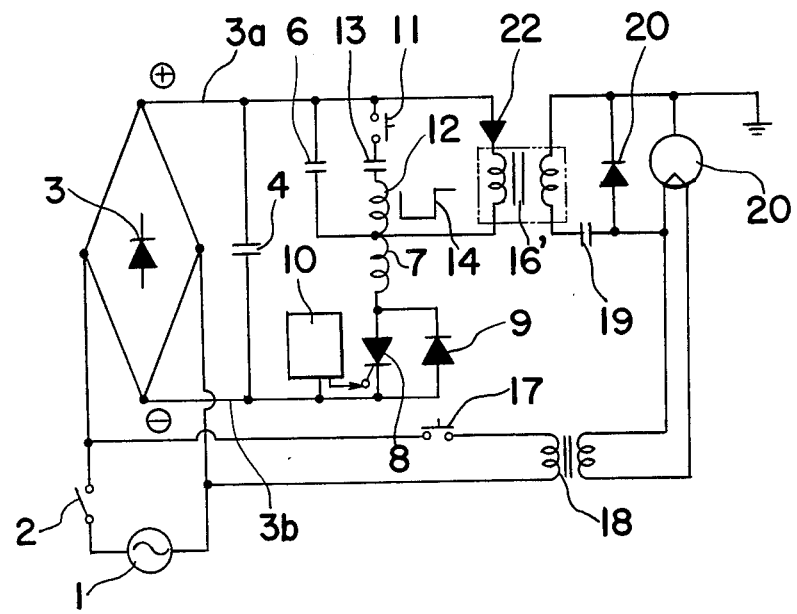
Figure 7:
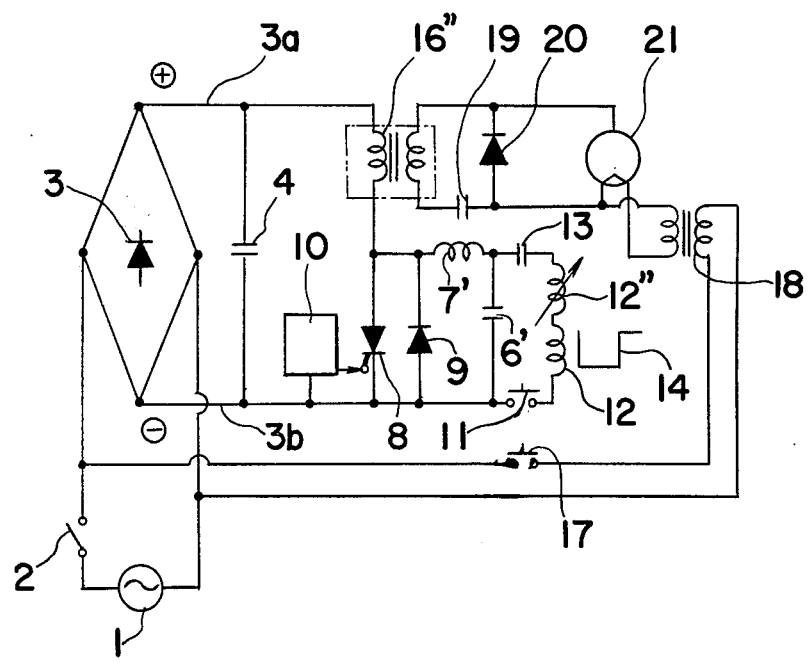

Referring also to FIGS. 6 and 7, there are shown still further modifications of the circuits of FIGS. 1 and 2. In each of these modifications, the heating coil 12 is connected in parallel to the commutation capacitor 6 or 6', while the power source for the magnetron 21 is taken out from the step-up transformer 16' or 16" which also serves as a choking coil. In the circuit of FIG. 6, a diode 22 is further inserted between the positive side of the circuit 3 and the primary winding of the transformer 16', and in the circuit of FIG. 7, a variable inductance 12" is connected in series with the heating coil 12 to vary the current through the heating coil 12 for output control.

It should be noted that in the circuit of FIG. 6, the thyristor 8 is in series relation to the series-connected capacitor 6 and inductance coil 7, whereas in the circuit of FIG. 7, the thyristor 8 is connected in parallel to the series-connected capacitor 6' and inductance coil 7' for constituting the essential part of the inverter unit.

Since functioning of the circuits of FIGS. 6 and 7 is fundamentally similar to that in the circuits of FIGS. 1, 2, 4 and 5, description thereof is abbreviated for brevity.

Figure 8:
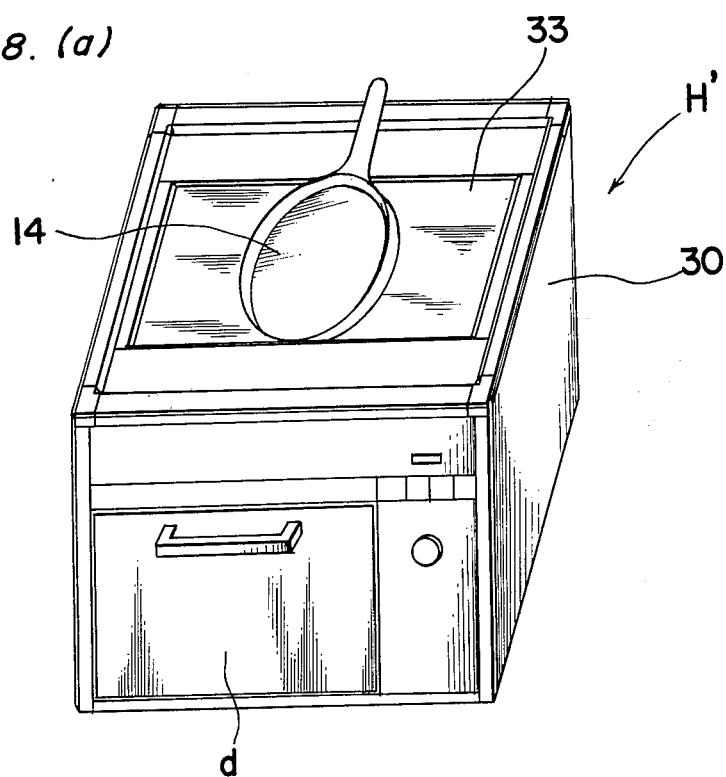
Figure 8:
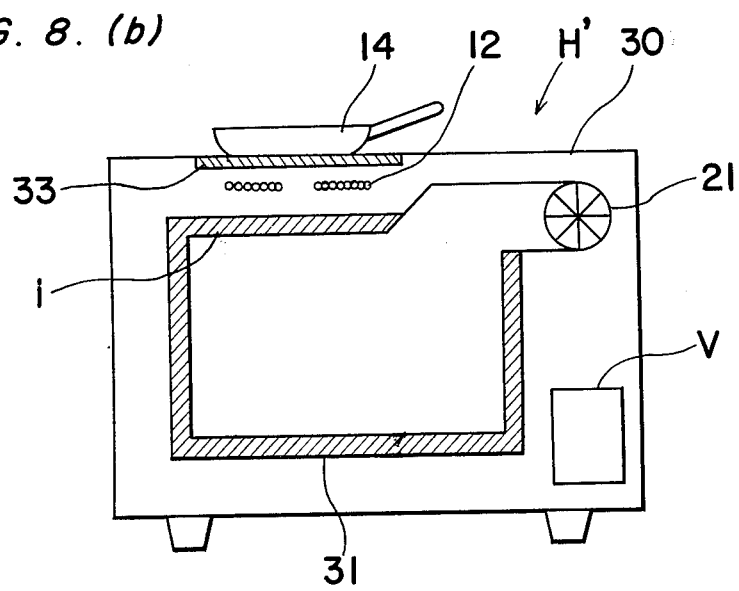

Referring to FIGS. 8a and 8b showing a modification of the heating apparatus of FIGS. 3a and 3b, by connecting a variable conductor or a saturable reactor, for example, the variable inductance 12'' as shown in FIG. 7 in series or parallel to the heating coil 12, the magnetron 21 can be independently controlled for output, so that the induction heating coil 12 may be disposed outside of the casing 30 of the apparatus H' for example, in the space between the top wall of the inner walls i and the corresponding top wall of the casing 30, with the ceramic or glass plate 33 being suitably fitted in a corresponding opening formed in the top wall of the casing 30 above the coil 12 for placing the pan or pot 14 thereon and for cooking food contained in such container 14 through the induction heating.

Figure 9:
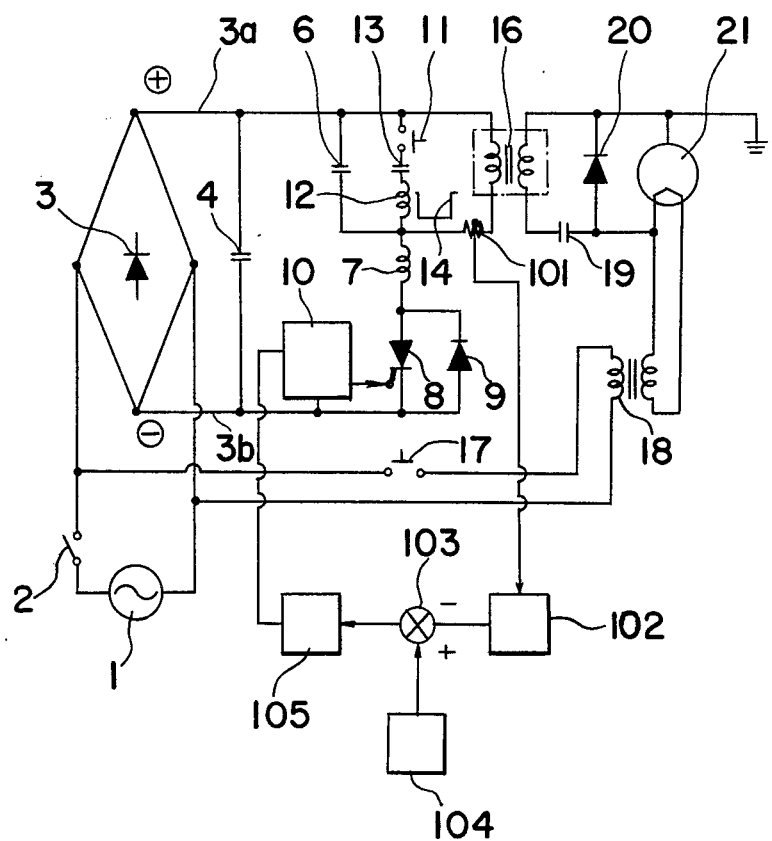
FIG. 9 is a similar diagram to FIG. 1, but particularly shows a further modification thereof.

Referring to FIG. 9, there is shown another modification of the circuit of FIG. 1. In this modification, the circuit further includes a current transformer 101 connected to the primary winding of the step-up transformer 16, a voltage transducer 102 connected to the current transformer 101 and also to the control circuit 10 through a comparison circuit 103 and a voltage-frequency converter circuit 105, and a current setting circuit 104 coupled to the comparison circuit 103.

By this arrangement, the high frequency current in the primary winding of the step-up transformer 16 detected by the current transformer 101 is converted into voltage through the voltage transducer 102 for comparison with the current setting circuit 104 by means of the comparison circuit 103 so as to obtain error signals, by which error signals the frequency of the voltage-frequency converter circuit 105 is varied for further variation of the trigger frequency of the control circuit 10 for the thyristor 8. Accordingly, by varying the set voltage of the current setting circuit 104, inverter output corresponding to the set output current can be obtained.

It should be noted here that the choking coil 5 described as connected in parallel to the commutation capacitor 6 in the circuit of FIG. 1 may be connected between the positive side of the D.C. voltage from the circuit 3 and the anode of the thyristor 8, and that the step-up transformer 16' of FIG. 6 may be altered to be connected in the similar manner to the above choking coil 5.

It should also be noted that feedback control may be effected through variation of the oscillation frequency of the inverter to such an extent that the heating coil current remains constant at all times, and that the output of the magnetron can be controlled by time ratio control of oscillation stoppage or by the oscillation frequency of the inverter.

As is clear from the foregoing description, according to the high frequency heating apparatus of the invention, the induction heating device is combined with the microwave oven, with the induction heating coil and the magnetron for the microwave oven being adapted to be controlled by one inverter unit, in which arrangement, not only the size of the high voltage transformer required in the conventional microwave oven is reduced to a large extent through employment of the high frequency inverter for power source, but it is made possible to heat metallic pans or pots containing food therein by the induction heating through the heating coil. The provision of the induction heating coil is particularly effective for readily forming the brown scorching on the surface of food, thus one of the most serious disadvantages inherent in the conventional microwave ovens being advantageously eliminated.

Furthermore, according to the high frequency heating apparatus of the invention, since the inverter unit is of simple construction employing one thyristor, the heating apparatus is accurate and reliable in functioning with consequent low cost in manufacturing. Additionally, the construction wherein the output from the inverter unit is directed to the induction heating coil on one hand and to the step-up transformer for the magnetron on the other makes it possible to form arrangement either for simultaneous energization of the magnetron and the heating coil, or for alternate energization of the same through actuation of the change-over switch, the latter arrangement of which may be preferable, taking into account the power source capacity and output capacity of the inverter unit, since the period of operation of the microwave oven is comparatively short when the heating apparatus is used for cooking purpose.

Although the present invention has been fully described by way of example with reference to the attached drawings, it should be noted that various changes and modifications are apparent to those skilled in the art. Therefore, unless otherwise such changes and modifications depart from the scope of the present invention, they should be construed as included therein.

What is claimed is:

1. A high frequency heating apparatus which comprises a unidirectional power source for converting input from an A.C. power source to D.C. voltage, an inverter for converting output from said unidirectional power source into high frequency power, a control circuit for said inverter, an induction heating coil for heating through electrical induction by high frequency magnetic flux, a high frequency oscillator which is energized by high voltage for radiating microwave energy, and a heating cavity in which the microwave energy from said high frequency oscillator is confined for effecting the dielectric heating, said inverter including at least one thyristor connected to a series-resonance circuit which has at least a commutation capacitor and a commutation inductor, said commutation capacitor being connected in parallel to a filter capacitor and said induction coil which are connected in series, with a step-up transformer for a high frequency oscillator being further connected in parallel to said commutation capacitor, thereby enabling said inverter to serve as a high voltage power source for applying the high voltage to said high frequency oscillator and also a high frequency power source for energizing said induction heating coil.

2. A high frequency heating apparatus as claimed in claim 1, wherein said thyristor for said inverter is connected in series to said series-resonance circuit.

3. A high frequency heating apparatus as claimed in claim 1, wherein said thyristor for said inverter is connected in parallel to said series-resonance circuit.

4. A high frequency heating apparatus as claimed in claim 1, wherein said step-up transformer for said high frequency oscillator is adapted to be selectively connected to an output of said inverter through switching means.

5. A high frequency heating apparatus as claimed in claim 1, wherein said high frequency oscillator has its heater connected to a secondary winding of a heater transformer, with a primary winding of said heater transformer being connected to said A.C. input power source.

6. A high frequency heating apparatus as claimed in claim 1, wherein said inverter includes at least a set of the thyristor and a diode connected in counter-parallel to each other, and the series-resonance circuit of the commutation capacitor and the commutation inductor, with a choking coil being connected in parallel to said commutation capacitor.

7. A high frequency heating apparatus as claimed in claim 1, wherein said inverter includes at least a set of the thyristor and a diode connected in counter-parallel to each other, and the series resonance circuit of the commutation capacitor and the commutation inductor, with a choking coil being connected in parallel to said series-resonance circuit.

8. A high frequency heating apparatus as claimed in claim 1, wherein said control circuit is provided with means for varying conducting intervals of said thyristor which constitutes said inverter so as to control oscillation output of said high frequency oscillator through said variation of the conducting intervals of said thyristor.

9. A high frequency heating apparatus as claimed in claim 1, wherein said control circuit includes means for controlling time ratio of oscillation and stoppage of said inverter, thereby to control output of said induction coil.

10. A high frequency heating apparatus as claimed in claim 1, wherein said control circuit includes means for controlling time ratio of oscillation and stoppage of said inverter, thereby to control output of said high frequency oscillator.

11. A high frequency heating apparatus as claimed in claim 6, wherein the primary winding of said step-up transformer is utilized also for said choking coil.

12. A high frequency heating apparatus as claimed in claim 7, wherein the primary winding of said step-up transformer is utilized also for said choking coil.

13. A high frequency heating apparatus as claimed in claim 8, wherein said means for varying conducting intervals of said thyristor is adapted to control conducting frequency of said thyristor, depending on current value of said step-up transformer and set voltage of said control circuit.

14. A high frequency heating apparatus which comprises a unidirectional power source for converting input from an A.C. power source to D.C. voltage, an inverter for converting output from said unidirectional power source into high frequency power, a control circuit for said inverter, an induction heating coil for heating through electrical induction by high frequency magnetic flux, a high frequency oscillator which is energized by high voltage for radiating microwave energy, and a heating cavity in which the microwave energy from said high frequency oscillator is confined for effecting the dielectric heating, said inverter including at least a set of a thyristor and a diode connected in counter-parallel to each other, with a series-resonance circuit of a commutation capacitor and a commutation inductor being connected in parallel to said set of the counter-parallel-connected thyristor and diode, thereby to form a closed loop by said thyristor, an input capacitor and a choking coil.

15. A high frequency heating apparatus as claimed in claim 14, wherein said commutation capacitor is connected in parallel to a series-circuit of a filter capacitor and a step-up transformer.

16. A high frequency heating apparatus as claimed in claim 14, wherein said commutation capacitor is connected in parallel to a series-circuit including a filter capacitor, said induction heating coil and a primary winding of a step-up transformer for said high frequency oscillator.

* * * * *